US012681068B2

(12) United States Patent
Baumgarth et al.

(10) Patent No.: US 12,681,068 B2
(45) Date of Patent: Jul. 14, 2026

(54) METHOD FOR EVALUATING AN ELECTRIC CONNECTION OF AN ELECTRIC ENERGY STORAGE DEVICE TO AN ONBOARD ELECTRICAL SYSTEM, ELECTRONIC BATTERY EVALUATING SYSTEM AND VEHICLE

(71) Applicants: Volkswagen Aktiengesellschaft, Wolfsburg (DE); AUDI AG, Ingolstadt (DE)

(72) Inventors: Marco Baumgarth, Vordorf (DE); Rolf Naumann, Michelau (DE)

(73) Assignees: VOLKSWAGEN AKTIENGESELLSCHAFT, Wolfsburg (DE); AUDI AG, Ingolstadt (DE)

( * ) Notice: Subject to any disclaimer, the term of this patent is extended or adjusted under 35 U.S.C. 154(b) by 160 days.

(21) Appl. No.: 18/715,413

(22) PCT Filed: Nov. 28, 2022

(86) PCT No.: PCT/EP2022/083533
§ 371 (c)(1),
(2) Date: May 31, 2024

(87) PCT Pub. No.: WO2023/099419
PCT Pub. Date: Jun. 8, 2023

(65) Prior Publication Data
US 2025/0027980 A1 Jan. 23, 2025

(30) Foreign Application Priority Data
Dec. 1, 2021 (DE) ..................... 10 2021 131 645.6

(51) Int. Cl.
*G01R 31/00* (2006.01)
*B60L 58/10* (2019.01)
(Continued)

(52) U.S. Cl.
CPC ............ *G01R 31/007* (2013.01); *B60L 58/10* (2019.02); *G01R 31/3842* (2019.01); *G01R 31/389* (2019.01); *B60L 2210/10* (2013.01)

(58) Field of Classification Search
CPC . G01R 31/007; G01R 31/389; G01R 31/3842
See application file for complete search history.

(56) References Cited

U.S. PATENT DOCUMENTS

2005/0075806 A1    4/2005   Phansalkar et al. ............ 702/63
2015/0008929 A1    1/2015   Ehrmann et al. ............. 324/426
(Continued)

FOREIGN PATENT DOCUMENTS

DE    102011087678 A1    6/2013   ........... B60R 16/033
DE    102014004791 B3    8/2015   ............. B60R 16/03
(Continued)

OTHER PUBLICATIONS

International Preliminary Report on Patentability, Application No. PCT/EP2022/083533, 9 pages, May 2, 2024.
(Continued)

*Primary Examiner* — Walter L Lindsay, Jr.
*Assistant Examiner* — Milton Gonzalez
(74) *Attorney, Agent, or Firm* — Slayden Grubert Beard PLLC

(57) ABSTRACT

The disclosure relates to a method for evaluating an electric connection of an electric energy storage device to an onboard electrical system of a vehicle. A voltage converter which is connected to the energy storage device is used to supply at least one component of the onboard electrical system with an output voltage of the voltage converter. The method comprises changing the specified voltage of the voltage converter in a specified time interval, whereby the battery voltage and the battery current of the energy storage device can be influenced, detecting the battery voltage of the (Continued)

energy storage device within the time interval, detecting the battery current of the energy storage device within the time interval, comparing the time curve of the battery voltage and the time curve of the battery current, and evaluating the electric connection on the basis of the compared time curves.

17 Claims, 3 Drawing Sheets

(51) Int. Cl.
G01R 31/3842 (2019.01)
G01R 31/389 (2019.01)

(56) References Cited

U.S. PATENT DOCUMENTS

| | | | |
|---|---|---|---|
| 2017/0153281 A1 | 6/2017 | Barth et al. | .................... 324/503 |
| 2017/0160348 A1* | 6/2017 | Din | ....................... H02J 7/0014 |
| 2017/0254860 A1 | 9/2017 | Stolczenberger et al. | |
| 2018/0059191 A1* | 3/2018 | Abu Qahouq | ....... G01R 31/392 |
| 2019/0195930 A1 | 6/2019 | Steffen | |

FOREIGN PATENT DOCUMENTS

| | | | |
|---|---|---|---|
| DE | 102014217087 A1 | 3/2016 | ............. G01R 19/02 |
| DE | 102016216845 A1 | 3/2018 | ........... B60R 16/033 |
| FR | 2963678 A1 | 2/2012 | ............. G01R 31/02 |
| FR | 3057672 A1 | 4/2018 | ............. G01R 31/02 |
| WO | 2015/025089 A1 | 2/2015 | ........... G01R 19/165 |
| WO | 2023/099419 A1 | 6/2023 | ............. G01R 31/00 |

OTHER PUBLICATIONS

German Office Action, Application No. 102021131645.6, 9 pages, Aug. 5, 2022.
International Search Report and Written Opinion, Application No. PCT/EP2022/083533, 24 pages, Mar. 28, 2023.

* cited by examiner

METHOD FOR EVALUATING AN ELECTRIC CONNECTION OF AN ELECTRIC ENERGY STORAGE DEVICE TO AN ONBOARD ELECTRICAL SYSTEM, ELECTRONIC BATTERY EVALUATING SYSTEM AND VEHICLE

CROSS-REFERENCE TO RELATED APPLICATIONS

This application claims priority to German Patent Application No. DE 10 2021 131 645.6, filed on Dec. 1, 2021 with the German Patent and Trademark Office. The contents of the aforesaid patent application are incorporated herein for all purposes.

BACKGROUND

This background section is provided for the purpose of generally describing the context of the disclosure. Work of the presently named inventor(s), to the extent the work is described in this background section, as well as aspects of the description that may not otherwise qualify as prior art at the time of filing, are neither expressly nor impliedly admitted as prior art against the present disclosure.

The disclosure relates to a method for evaluating an electric connection of an electric energy storage device to an onboard electrical system of an at least partially electrically operated vehicle, wherein the onboard electrical system is supplied with electric energy by the electric energy storage device, and with a voltage converter of the onboard electrical system, which is connected to the electric energy storage device, at least one component of the onboard electrical system is supplied with an output voltage of the voltage converter.

Furthermore, the disclosure relates to an electronic battery evaluating system with an assessing unit and at least one detecting unit. The disclosure also relates to a vehicle with an electronic battery evaluating system.

Electrically operated vehicles, for example an electric vehicle or a hybrid vehicle, comprise a complex electric onboard electrical system. Therein, this onboard electrical system can be divided into partial onboard electrical systems, wherein a specific voltage level is associated with each of these partial onboard electrical systems. In such electrically operated vehicles, it is important to examine if the battery is still connected in the onboard electrical system and thus is available. Hereto, different diagnostic methods in the prior art can be used to recognize if the battery is still connected in current carrying manner in the vehicle with active onboard electrical system. Herein, it can be determined if the state of the battery is "battery disconnected", thus the battery is no longer connected.

Therein, one problem is in that the battery of the vehicle is connected in parallel with a further voltage source and thereby a simple voltage measurement or a response to a voltage drop is not sufficient to be able to detect this. A further method today is actively determining the internal resistance of the battery via diverse methods.

In simple voltage measurements, the disadvantage arises that a further voltage source to the battery, in particular generator or DC/DC converter, is active and the system is still operated therefore. Thus, a simple voltage measurement is ruled out. In determination of the, in particular ohmic, portion of the internal resistance of the battery, the problem arises that by the interruption, for example in the current path, measurement of AD converter noise occurs in the current measurement, this noise is statistically distributed and therefore good or poor values can randomly occur. Herein, one would instead expect that the values tend to infinitely large. It can be equally problematic that the excitation in the vehicle only offers a low excitation due to the actual onboard electrical system situation and accordingly the assessment cannot occur.

SUMMARY

A need exists to provide a way to examine an electric connection of an electric energy storage device to an onboard electrical system of a vehicle in a simpler manner.

The need is addressed by the subject matter of the independent claim(s). Embodiments of the invention are described in the dependent claims, the following description, and the drawings.

DESCRIPTION

Figure 1:
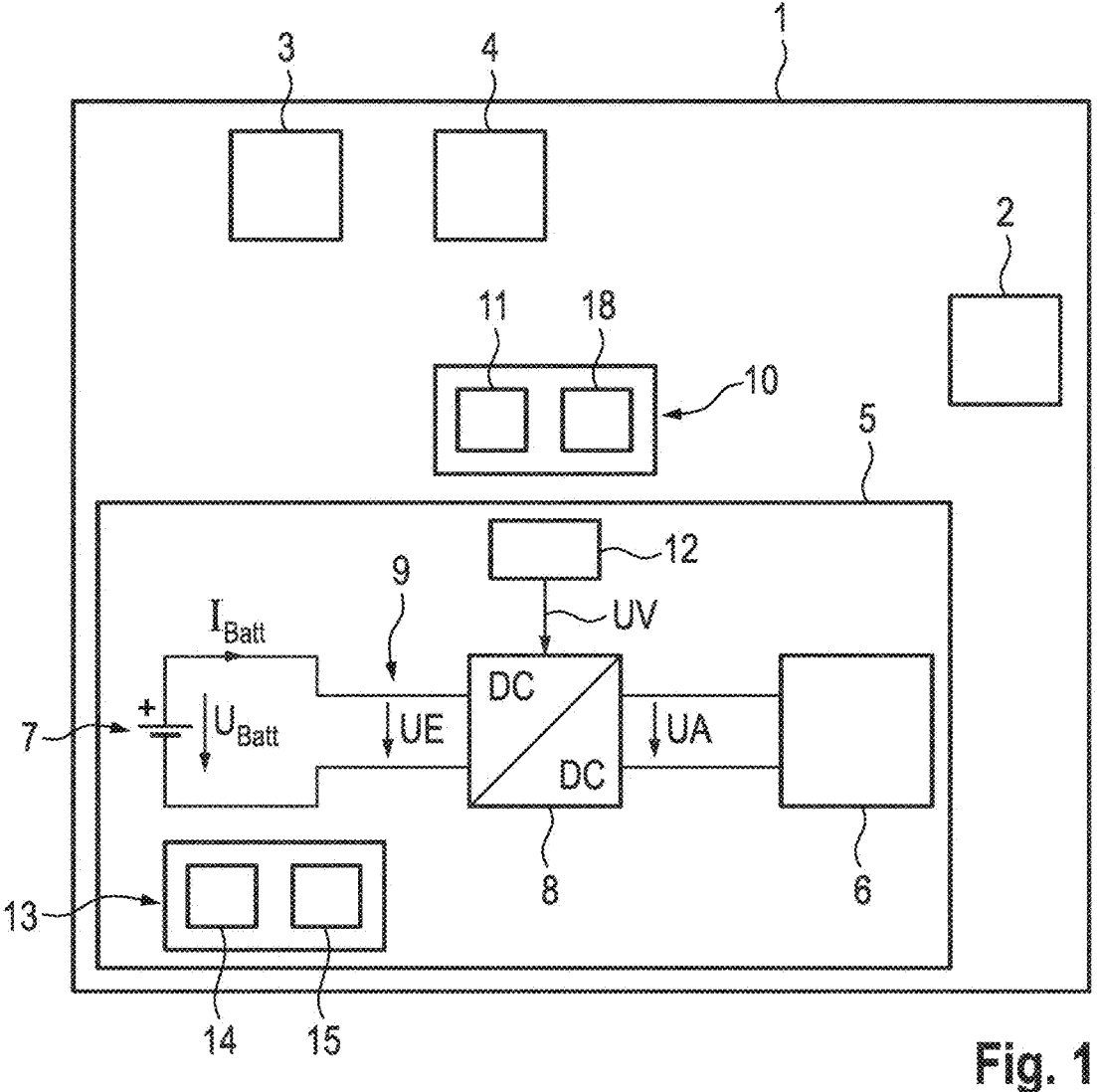
FIG. 1 shows a schematic representation of an example vehicle with at least one electric energy storage device and at least one electric onboard electrical system and an electronic battery evaluating system.

The details of one or more embodiments are set forth in the accompanying drawings and the description below. Other features will be apparent from the description, drawings, and from the claims.

In the following description of embodiments of the invention, specific details are described in order to provide a thorough understanding of the invention. However, it will be apparent to one of ordinary skill in the art that the invention may be practiced without these specific details. In other instances, well-known features have not been described in detail to avoid unnecessarily complicating the instant description.

Some embodiments relate to a method for evaluating an electric connection of an electric energy storage device to an onboard electrical system of an at least partially electrically operated vehicle, wherein the onboard electrical system is supplied with electric energy by the electric energy storage device, and with a voltage converter of the onboard electrical system, which is connected to the electric energy storage device, at least one component of the onboard electrical system is supplied with an output voltage of the voltage converter, comprising:

changing a specified voltage of the voltage converter, by which the output voltage can be specified, in a specified time interval, whereby a battery voltage and a battery current of the electric energy storage device can be influenced, detecting the battery voltage of the electric energy storage device within the time interval by a detecting unit, detecting the battery current of the electric energy storage device within the time interval by a detecting unit, comparing a time curve of the battery voltage and a time curve of the battery current by an assessing unit, evaluating the electric connection of the electric energy storage device to the onboard electrical system depending on the compared time curves of the battery voltage and of the battery current by the assessing unit.

By the proposed method, a simple recognition or examination can be performed if a vehicle battery is electrically connected to the vehicle onboard electrical system. Expressed in other words, a recognition can be performed if the actual battery of the vehicle is still connected and available in the onboard electrical system. Thus, an actual onboard electrical system connectivity of the vehicle battery can be performed. In particular, this can be performed with the aid of the proposed method in a manner simpler, more reduced in cost and more minimized in effort.

Based on the evaluation of the electric connection of the electric energy storage device to the onboard electrical system depending on the compared time curves, it can be determined if the electric energy storage device is actually electrically connected or wired to the onboard electrical system. With the aid of the performed evaluation, a state or a quality of the electric connection of the electric energy storage device to the onboard electrical system can also be examined or monitored.

The electric energy storage device is for example a vehicle battery or an accumulator. In particular, the electric energy storage device can be a high-voltage battery. The onboard electrical system can for example be the entire onboard electrical system of the vehicle or a partial onboard electrical system of the vehicle. In particular, the vehicle can be an energy supply system of the vehicle. With the aid of the electric energy storage device and the onboard electrical system, an electric drive machine, in particular an electric motor, of the vehicle can for example be operated such that the vehicle can be moved.

For example, the onboard electrical system can be a low-voltage onboard electrical system, by which electrical loads can be electrically operated or supplied. Therein, the components of the onboard electrical system can be low-voltage components.

For example, these components can have a voltage level between 11 and 14 Volts, in particular of 12 Volts. For example, the onboard electrical system can be a 12 Volt onboard electrical system or a 24 Volt onboard electrical system of the vehicle. In this case, it can thus be a partial onboard electrical system of a high-voltage onboard electrical system of the vehicle. In particular, the components of the onboard electrical system can be safety-relevant systems like steering systems or braking systems. Since such safety-critical systems have to be secured by means of a redundant voltage supply, a present, in particular functional, electric connection between the onboard electrical system and the electric energy storage device is of importance.

In order to be able to electrically supply the component or the components with a corresponding voltage, in particular a low voltage, a voltage of the electric energy storage device can be converted or transformed by a voltage converter.

For example, the voltage converter can be a DC voltage converter, a DC-DC converter or a direct current generator. The voltage converter can be supplied with the voltage of the electric energy storage device at its input as the input voltage, such that this input voltage can be converted into a corresponding output voltage with the aid of the voltage converter. The output voltage can be provided or transferred to the at least one component of the onboard electrical system or further systems or units of the onboard electrical system.

For example, with the aid of a regulation and/or control unit, the specified voltage of the voltage converter can be varied or changed. With the aid of the specified voltage, the voltage converter can in particular be parameterized or adjusted such that a desired output voltage of the voltage converter can be output. In particular, the input voltage of the voltage converter is converted into the output voltage depending on the preset specified voltage. In other words, the specified voltage presets, which voltage level is to be present or exist at the output of the voltage converter. The change of the specified voltage is effected alternatingly in time. In a specified time interval or within a period of time, the specified voltage is changed. For example, this can be automatically effected by the control and/or regulation unit. By the change of the specified voltage and thus the voltage conversion of the voltage converter, the electric energy storage device, if it is connected to the voltage converter, experiences an influence or a change. Thus, the battery voltage and/or the battery current of the electric energy storage device can be influenced, in particular impaired, by the change of the specified voltage. Expressed in other words, the voltage converter can be actively excited with the aid of the change of the specified voltage and be supplied or impressed with a virtual disturbance frequency.

For example, the change of the specified voltage can periodically change every 100 milliseconds.

For example, the battery voltage can be detected or measured with the aid of a voltage measurement. Hereto, a voltage measuring apparatus can for example be used as the detecting unit. The battery current can be detected or measured by means of a current measurement or current detection. Hereto, a current measuring apparatus can be used as the detecting unit. In particular, the battery voltage and the battery current can be detected by means of one and the same detecting unit. In this case, it can be a measurement device, which can measure both voltages and currents. Otherwise, it can be a first detecting unit for detecting the battery voltage on the one hand and a second detecting unit for detecting the battery current.

In particular, a respective time curve or time progression of the battery voltage and of the battery current is detected or recorded within the time interval, thus as long as the specified voltage is changed. These two time curves of the battery voltage and of the battery current are compared, in particular analyzed, by means of the assessing unit, in particular an electronic assessing unit or computing unit. Therein, these time curves are compared or examined to the effect if changes, which have been caused by the changed specification of a voltage converter, can be detected. Thus, it can be determined in the time curves of the battery voltage and of the battery current if the specified voltage of the voltage converter has been changed. Expressed in other words, the changed specified voltage has an effect in the time curves of the battery voltage and of the battery current. This is because the voltage converter can be referred to as load or electric load of the electric energy storage device. Thus, with the aid of the changed specified voltage of the voltage converter, a change of the load of the electric energy storage device can be caused. Subsequently, this can be taken into account or considered in the evaluation of the electric connection of the electric energy storage device to the onboard electrical system. Therein, it is especially observed in the evaluation if the changed specified voltage or the temporally changed specified voltage of the voltage converter is recognizable or detectable in the time curves of the battery voltage and of the battery current. If this should be the case, thus, it can be inferred that the electric energy storage device is electrically connected to the onboard electrical system. Otherwise, a faulty or damaged electric connection is present.

For example, a result of the performed evaluation of the electric connection can be supplied or provided to a safety system of the vehicle or another device of the vehicle.

For example, the change of the specified voltage of the voltage converter can be performed in repeating manner until the battery or the electric energy storage device of the vehicle has been recognized as present. For example, the change of the specified voltage can be repeated or performed ten times, in particular twenty times, or in a range between ten and twenty repetitions.

By the proposed method, complex frequency generator controls for defining a frequency specification, whereby disturbances can be generated, can be omitted. This can be prevented by the proposed method.

By the proposed method, a disturbance frequency can be impressed by means of the voltage converter, in particular in a specified time cycle. Thereby, detuning of the voltage converter can be generated such that this detuning is sufficient to develop the excitation as strong as it is sufficient for internal resistance determination.

In some embodiments, it is provided that the specified voltage is changed in the time interval such that a voltage value of the specified voltage is increased or decreased by a specified voltage value, in particular the voltage value of the specified voltage is periodically increased or decreased by the specified voltage value. In particular, the change of the specified voltage is effected in repeating or alternating manner.

For example, the voltage value of the specified voltage can be increased for 100 milliseconds and again be decreased for 100 milliseconds after elapse of these 100 milliseconds. Therein, the increase or decrease of the voltage value is always effected from the initial value of the voltage value of the specified voltage.

For example, the specified voltage is increased by 50 millivolts for 100 milliseconds, subsequently the specified voltage is decreased by 50 millivolts for 100 milliseconds. Thus, a periodically alternating increase or step-down by the voltage value of the specified voltage, in particular the basic value of the specified voltage, is varied. Thus, a periodic change of the specified voltage can be performed. This can be effected by excitation by means of the change of the specified voltage of the voltage converter.

In particular, the specified voltage of the voltage converter can be varied by a typical time cycle of for example 100 milliseconds. This is alternatingly effected around the specification of the actual voltage value of the specified voltage. For example, the specified voltage can have 13.8 Volts, such that 13.85 Volts or 13.75 Volts is alternatingly adjusted as the specified voltage. This is effected in a periodic operation. The specified voltage value is such a value or reference value, in which characteristics of the onboard electrical system and/or of the at least one component do not change, but an impact on the battery voltage and on the battery current is detectable. In particular, the specified voltage value should be defined or specified such that at least no, in particular no considerably noticeable influence on characteristics of the onboard electrical system and/or other systems of the vehicle is exerted.

By the change of the specified voltage of the voltage converter, the electric energy storage device does not experience a severe current drain, but only a short peak or current peak. This can be detected in the time curves or in temporal progressions.

In some embodiments, it is provided that in comparing the time curves of the battery voltage and of the battery current, it is examined if these two time curves are in phase. Thus, the evaluation of the electric connection of the electric energy storage device to the onboard electrical system is effected by examining the phases of the battery voltage and of the battery current. Thus, a simple method minimized in effort can be provided to examine if the electric energy storage device is still connected to the onboard electrical system. In particular, the examination is effected such that it is examined if the battery current and the battery voltage are in phase. If the electric energy storage device is still connected to the onboard electrical system, thus, the battery current and the battery voltage are in direct proportionality with excited voltage converter. If the electric energy storage device should no longer be connected to the onboard electrical system, thus, the battery voltage and the battery current are no longer in phase and in particular these two do not have proportionality to each other anymore.

Put another way, if with the excitation of the voltage converter by the changed specified voltage, the measured battery voltage and the measured battery current are still in phase, then it can be assumed that the electric energy storage device is correspondingly still present or connected in the electric circuit of the onboard electrical system.

If the electric energy storage device is not, in particular only insufficiently, connected to the onboard electrical system, thus, the current and the voltage are not in phase. In such a case, the detecting units would detect statistic noise or stochastic fluctuation as the battery current.

By the proposed method, it can in particular be examined if the signals of battery current and battery voltage are in phase.

In some embodiments, it is provided that by changing the specified voltage, a determination of an internal resistance of the electric energy storage device is excited. In particular, the change of the specified voltage of the voltage converter is effected such that a corresponding excitation is sufficient for the internal resistance determination of the electric energy storage device. Therefore, the specified voltage should be set such that an accurate and in particular effective determination of the internal resistance can be performed. In particular, the determination of the internal resistance of the electric energy storage device can be performed if the battery current and the battery voltage are in phase. Thus, the battery voltage and the battery current are proportional to each other.

With a connected electric energy storage device, a constant internal resistance results since the battery current and the battery voltage are proportional to each other. Expressed in other words, with in-phase condition between the battery current and the battery voltage, an ohmic resistance or an ohmic portion of the internal resistance of the electric energy storage device can be determined. This is an indicator that the electric energy storage device is, in particular functionally, electrically connected to the onboard electrical system. If the connection should be faulty or be disconnected, thus, the ratio of the battery voltage and of the battery current is not proportional to each other, such that an ohmic resistance cannot be determined. This can be taken into account in evaluating the electric connection.

With the aid of the proposed method, a current change of the electric energy storage device can in particular be achieved by changes of the voltage specification, such that a specific assessment of an ohmic portion of the internal resistance of the electric energy storage device can be performed.

By the determination of the internal resistance, a performance of the electric energy storage device can be assessed.

By the variably configured specified voltage or voltage specification, the battery current can respond to excitation of the voltage converter. Thereby, an excitation arises to be able to determine the internal resistance.

In some embodiments, it is provided that the determination of the internal resistance is performed depending on an average voltage of the time curve of the battery voltage and an average current of the time curve of the battery current. Thus, the determination of the internal resistance is effected via a quotient of an average current and an average voltage. The average voltage of the time curve of the battery voltage and the average current of the time curve of the battery current can for example be ascertained or determined with the aid of the assessing unit. An average voltage or an average value of the battery voltage and the average current or average value of the battery current can for example respectively be a root mean square value of the battery voltage and a root mean square value of the battery current. Thereby, a more efficient, in particular more accurate, determination of the internal resistance can be performed. The determined internal resistance can be taken into account or used as a further indicator in evaluating the electric connection of the electric energy storage device to the onboard electrical system.

In some embodiments, it is provided that the change of the specified voltage is effected depending on a specified switching frequency. For example, the specified switching frequency addresses to the specified time interval. In particular, the specified switching frequency is used by the control and/or regulation unit to alternatingly change the specified voltage. Thus, the voltage converter can be correspondingly excited with the aid of the specified switching frequency and the specified voltage can be varied. Thereby, the voltage converter can be regulated or excited such that the time curves of the battery voltage and of the battery current can be detected and used for evaluating the connectivity of the electric energy storage device.

For example, a periodic change of the specified voltage can be performed with the aid of the switching frequency. For example, the specified voltage can be referred to as control and/or regulation parameter of the voltage converter.

In some embodiments, it is provided that the time curves are filtered with a digital filter depending on the changed specified voltage for comparing the time curves of the battery voltage and of the battery current. Hereto, a bandpass or a bandpass filter can for example be used as the digital filter. With the aid of the digital filter, a corresponding frequency range can be limited or specified, within which the battery current and the battery voltage are analyzed. The specified time interval can be filtered, thus, disturbance parameters can be eliminated and a better evaluation of the electric connection can be performed.

In some embodiments, it is further provided that immediately after changing the specified voltage, a step response is respectively ascertained as a time curve of the battery voltage and of the battery current. For example, the respective step responses can be detected with the aid of the detecting unit or the detecting units. With the aid of the assessing unit or an electronic circuit, the step responses can also be determined. Expressed in other words, by the change or excitation of the voltage converter by means of the specified voltage, a current response and a voltage response can be generated. For example, the step response of the battery current can be a current response or current pulse. The step response with respect to the battery voltage can be a voltage exciter. In detecting the battery voltage and battery current, the respective current responses can be detected or recorded based on the time curves. If the two step responses should be equal in period, thus, an intact connection of the electric energy storage device can be assumed.

Further embodiments relate to an electronic battery evaluating system with an assessing unit and at least one detecting unit, wherein the electronic, in particular electric, battery evaluating system is formed for performing a method according to the teachings herein or some embodiments thereof. In particular, the previously described method or some embodiments thereof can be performed with the just described battery evaluating system.

The battery evaluating system can for example be an electronic measurement device or an electric circuit. For example, the battery evaluating system can be an onboard electrical system or an electric onboard electrical system of an at least partially electrically operated vehicle. With the aid of the battery evaluating system, it can in particular be evaluated or assessed or determined whether or not a vehicle battery of the at least partially electrically operated vehicle is actually connected to the onboard electrical system.

Further embodiments relate to a vehicle with a battery evaluating system according to the teachings herein or some embodiments. For example, the vehicle can be an at least partially electrically operated vehicle such as for example an electric vehicle or a hybrid vehicle. For example, the vehicle can comprise an electric onboard electrical system. In particular, the battery evaluating system can be formed as a standalone unit or device or system, or it can be a constituent of the onboard electrical system.

A battery, for example an electric energy storage device, in the sense of the teachings herein comprises at least one and in particular multiple battery cells interconnected to each other in electrically conducting manner, wherein such a battery cell for example provides a voltage in the range of 3.5 and 4.0 Volts. Therein, such a battery cell can for example be formed as a prismatic cell, pouch cell or round cell. For example, the battery is configured as a so-called high-voltage battery, which is configured to provide an electrical voltage in the range of more than 60 Volts, in particular in the range of several 100 Volts. Such a high-voltage battery can be arranged in a motor vehicle, where it can supply an electric load, in particular a drive motor, with electric energy.

Beneficial embodiments of the method are to be regarded as beneficial embodiments of the electronic battery evaluating system as well as of the vehicle and vice versa.

Embodiments of the electronic battery evaluating system and of the vehicle, which comprise features, as they have already been described in context of the embodiments of the method, also belong to the teachings herein. For this reason, the corresponding embodiments of the electronic battery evaluating system according and of the vehicle are not again described here.

The teachings herein also includes combinations of the features of the described embodiments.

Reference will now be made to the drawings in which the various elements of embodiments will be given numerical designations and in which further embodiments will be discussed.

In the embodiments described herein, the described components of the embodiments each represent individual features that are to be considered independent of one another, in the combination as shown or described, and in combinations other than shown or described. In addition, the described embodiments can also be supplemented by features other than those described.

In the FIGS., functionally identical elements are each provided with the same reference numerals.

FIG. 1 shows a schematic view of an at least partially electrically operated vehicle 1. The vehicle 1 can for example be an electric vehicle or a hybrid vehicle.

For example, the vehicle 1 comprises an electric drive assembly 2, by which the vehicle 1 can be moved. In order that the vehicle 1 can be driven with the aid of the electric drive assembly 2 or with an electric motor for performing a movement drive, the vehicle 1 can comprise at least one electric onboard electrical system 3 and for example a high-voltage battery 4. The high-voltage battery 4 for example has a voltage in the high-voltage range. The onboard electrical system 3 can for example be a high-voltage onboard electrical system. The onboard electrical system 3 and the high-voltage battery 4 can for example be used for supplying the electric drive assembly 2.

Since the vehicle 1 can for example be a highly automated vehicle, the vehicle 1 can comprise numerous safety systems and/or driver assistance systems. They can for example be used for steering and for braking. Since these systems in particular require a redundant voltage supply, the vehicle 1 can for example comprise an additional onboard electrical system 5. The onboard electrical system 5 can for example be a low-voltage onboard electrical system compared to the onboard electrical system 3. Similarly, the onboard electrical systems 3, 5 can be one and the same onboard electrical system. For example, the onboard electrical system 3 can be a first partial onboard electrical system and the onboard electrical system 5 can be a second partial onboard electrical system of a superordinated onboard electrical system of the vehicle 1. For example, the onboard electrical system 5 can be used to operate at least one component 6 and in particular to supply it with electric energy. Thereto, the onboard electrical system 5 can comprise electric energy storage devices 7 different from the high-voltage battery 4. For example, the electric energy storage device 7 can be a vehicle battery or an accumulator. In contrast to a high-voltage battery 4, the electric energy storage device 7 can for example be a battery in the low-voltage range. For example, the electric energy storage device 7 can be indirectly connected to the high-voltage battery 4. In particular, the electric energy storage device 7 and the onboard electrical system 5 can have a voltage level of 12 Volts, 24 Volts, 36 Volts or 48 Volts.

In order to be able to efficiently supply in particular the at least one component 6, which can for example be a safety system or a longitudinal system or a braking system, with a suitable voltage, the onboard electrical system 5 comprises at least one voltage converter 8. The voltage converter 8 can for example be a DC voltage converter. With the aid of the voltage converter 8, a battery voltage $U_{batt}$ of the electric energy storage device 7 can for example be converted into an output voltage UA. Hereto, the battery voltage $U_{batt}$ of the electric energy storage device 7 can be supplied or provided to the voltage converter 8 as the input voltage UE. This input voltage UE applied to the voltage converter 8 can subsequently be converted or transformed into the output voltage UA. For example, the output voltage UA can be between 10 Volts and 48 Volts. In particular, the output voltage UA can have any value within this interval.

In particular, the input voltage UE, the output voltage UA and the battery voltage $U_{batt}$ are a DC voltage.

Since the electric energy storage device 7 is for example used as a redundant voltage supply, a functional and in particular complete electric connection 9 of the electric energy storage device 7 to the onboard electrical system 5 is of importance. Thereto, this electric connection 9 can be examined or assessed if this electric connection 9 is still sufficient or even is completely disconnected or separated. Hereto, an electronic battery evaluating system 10 can for example be used. With the aid of the battery evaluating system 10, which can for example be referred to as electronic system or electronic device, the electric connection 9 or a connectivity of the electric energy storage device 7 or of the vehicle battery can be performed. Hereto, the battery evaluating system 10 can for example comprise an assessing unit 11, in particular an electronic assessing unit. The assessing unit 11 can for example be a computing unit. The electronic battery evaluating system 10 can for example be a constituent of the vehicle 1, in particular of the onboard electrical system 5. Similarly, the electronic battery evaluating system 10 can be a standalone unit or system.

Now, in order to be able to examine if the electric energy storage device 7 is still connected to the onboard electrical system 5, in that the voltage converter 8 is excited. Hereto, a control and/or regulation parameter can be used. For example, a disturbance parameter or an excitation is applied to the voltage converter 8. In particular, an impression of a disturbance frequency is effected by means of the voltage converter 8, in particular in a specified time cycle to be able to evaluate the electric connection 9.

Hereto, a temporally alternating change of a specified voltage UV of the voltage converter 8 can in particular be performed. In particular, a periodic adaptation or variation of the specified voltage UV of the voltage converter 8 is effected. With the aid of the specified voltage UV, the voltage converter 8 can be regulated or controlled such that a desired output voltage UA results. For the change of the specified voltage UV, a control and/or regulation unit 12 can for example be provided. For example, it can be a constituent of the electronic battery evaluating system 10. With the aid of this control and/or regulation unit 12, the voltage converter 8 can be regulated and/or controlled. In particular, the change of the specified voltage UV is effected in a specified time interval T (compare FIG. 2 and FIG. 3). By this development of a change of the supply voltage 12, the battery voltage $u_{batt}$ and a battery current $I_{batt}$ can be influenced. For example, the voltage converter 8 can be regarded as a consumer or load of the electric energy storage device 7. Thus, by a change of the voltage converter 8 in itself, a change of the electric energy storage device 7 and in particular of the tapped current can be varied. By the temporally periodic change of the specified voltage UV, a load behavior of the electric energy storage device 7 can change such that the battery current $I_{batt}$ and the battery voltage $U_{batt}$ are at least indirectly influenced.

For example, the specified voltage UV of the voltage converter 8 can be alternatingly stepped up by for example 0.05 Volts or down by 0.05 in a specified time cycle around the specification of the actual voltage value. This detuning is sufficient to develop an excitation of the electric energy storage device 7 as strongly as an internal resistance of the electric energy storage device 7 can for example be determined. For example, the specified time interval T, in which the specified voltage temporally changes, can be 100 milliseconds, for example between 20 milliseconds and 200 milliseconds. In particular, the time interval can be specified by the electronic battery evaluating system 10.

In order to be able to evaluate the excitation generated by the changed specified voltage UV, the battery current $I_{Batt}$ and the battery voltage $U_{Batt}$ can be detected or measured or recorded within the time interval T. Hereto, a measurement device 13 can be used.

For example, the measurement device 13 can be formed as a superordinated detecting unit, by means of which both a voltage and a current can be measured or detected. It is also conceivable that the battery voltage $U_{Batt}$ is detected by a detecting unit 14, in particular a first detecting unit, and the battery current $I_{Batt}$ is detected by a detecting unit 15, in particular a second detecting unit 15. For example, the detecting units 14, 15 can be a constituent of the measurement device 13. In particular, the detecting units 14, 15 can be a constituent of the electronic battery evaluating system 10 or of the onboard electrical system 5.

In particular, the battery voltage $U_{Batt}$ and the battery current $I_{Batt}$ are detected such that a time curve 16 (cf. FIG. 3) of the battery voltage $U_{Batt}$ and a time curve 17 (cf. FIG. 2) of the battery current $I_{Batt}$ can be detected or determined.

The two detected or determined time curves 16, 17 can be compared or analyzed with the aid of the assessing unit 11. Therein, the electric connection 9 is evaluated with the aid of this performed comparison.

Figures 2, 3:
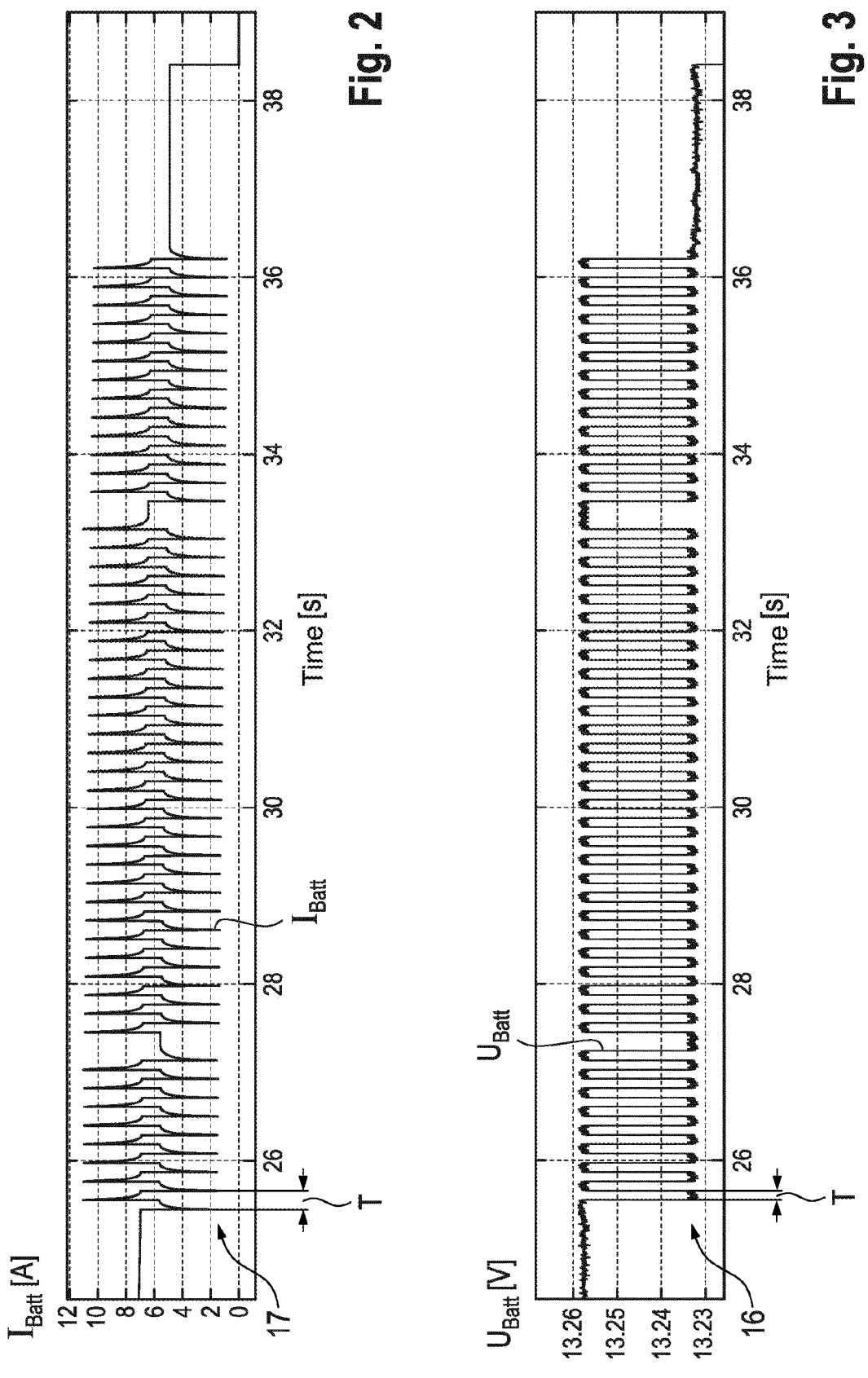
FIG. 2 shows an example time curve of a battery current of the electric energy storage device from FIG. 1.
FIG. 3 shows an example time curve of a battery voltage of the electric energy storage device from FIG. 1.

Therein, the two time curves 16, 17 are in particular compared such that it is examined if the two time curves 16, 17 and thus the battery current $I_{Batt}$ and the battery voltage $U_{Batt}$ are equal in phase or in phase. If the two time curves 16, 17 should be in phase after the change of the specified voltage UV, thus, an intact or correct electric connection 9 between the electric energy storage device 7 and the onboard electrical system 5 is present. In FIGS. 2 and 3, the time curves 16, 17 are in phase.

With the aid of the control and/or regulation unit 12, a specified switching frequency for the adaptation or change of the specified voltage UV can for example be used. In particular, the switching frequency addresses to the time interval T. For example, the switching frequency can be dependent on the time interval T. For example, the switching frequency can be determined from a reciprocal value of the time interval T.

For comparing the time curves 16, 17, the time curves 16, 17 can for example be filtered by a digital filter 18. The digital filter 18 can for example be a bandpass filter. In particular, the time curves 16, 17 can be prefiltered with the aid of the digital filter 18. With the aid of the detecting unit 14, 15 or the assessing unit 11, a step response can for example be respectively determined as the time curve 16, 17 of the battery voltage $U_{Batt}$ and of the battery current $I_{Batt}$ immediately after changing the specified voltage UV. Furthermore, the specified voltage can be changed in the time interval T such that a voltage value of the specified voltage UV is increased or decreased by a specified voltage value. In particular, the voltage value of the specified voltage UV is periodically increased or decreased by a specified voltage value. This is carried out using the control and/or regulation unit 12, for example.

For example, the specified voltage UV can have an actual value of 13.8 V. With the aid of the change, this actual value of the specified voltage UV can be respectively alternatingly stepped up by 0.05 V or down by 0.05 V. Expressed in other words, the specified voltage UV can for example be alternatingly varied every 100 ms by 50 mV from the specification. In this example, the specified voltage would be set to 13.85 V for 100 ms and subsequently set to 13.75 V for 100 ms. This can periodically or continuously repeat. In particular, this is effected until the electric energy storage device 7 can for example be assessed as connected to the onboard electrical system 5.

By the change of the specified voltage UV, a determination of an internal resistance of the electric energy storage device 7 can for example be performed or excited. Therein, for the determination of the internal resistance, an average voltage of the time curve 16 of the battery voltage $U_{Batt}$ and an average current of the time curve 17 of the battery current $I_{Batt}$ can be performed. Here, the determination of the internal resistance is in particular effected with a $\Delta U_{Batt}/ \Delta I_{Batt}$ method or by the formula dU/dI.

Figure 4:
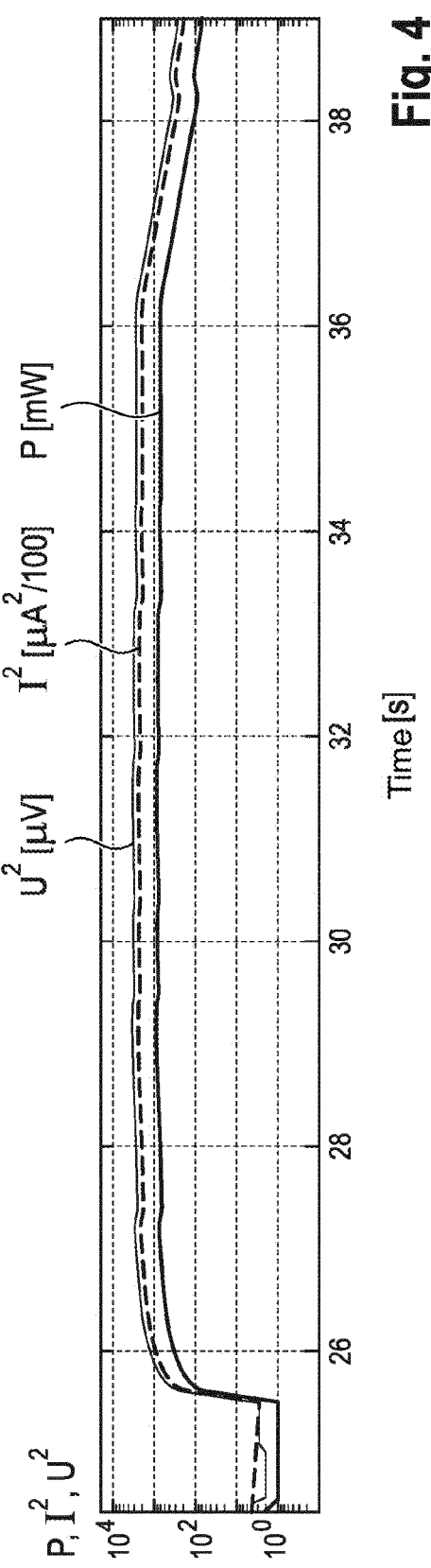
FIG. 4 shows an example time curves of an electric power, of the battery voltage and of the battery current of the electric energy storage device from FIG. 1.

In FIG. 4, it is for example illustrated how an exemplary curve of a power and of a quadratic current curve as well as of a quadratic voltage curve of the battery with respect to the battery voltage $U_{Batt}$ and the battery current $I_{Batt}$. Here, the magnitudes with respect to the changes are in particular plotted. This can also be used to examine if the excitation of the voltage converter 8 with respect to the specified voltage UV is sufficient.

For example, if the internal resistance is not constant, since the battery current $I_{Batt}$ statistically spreads, thus, in-phase condition of the battery current $I_{Batt}$ and the battery voltage $U_{Batt}$ is not present. If the excitation is not sufficient, it is also likely that the electric energy storage device 7 cannot be determined and correspondingly cannot be regarded as present in the onboard electrical system 5. If it is possible that the internal resistance can be determined and the step responses are in phase and sufficiently developed, then, the electric energy storage device 7 can be regarded as connected to the onboard electrical system 5.

In particular, the indicated voltage and current values can be exemplary values. In particular, the indicated current and voltage values can have measurement tolerances or tolerances. In particular, the indicated current values and voltage values can have a deviation of 5%, in particular 10%.

LIST OF REFERENCE NUMERALS

1 Vehicle
2 Electric drive assembly
3 Onboard electrical system
4 High-voltage battery
5 Onboard electrical system
6 Component
7 Electric energy storage device
8 Voltage converter
9 Electric connection
10 Electronic battery evaluating system
11 Assessing unit
12 Control and/or regulation unit
13 Measurement device
14, 15 Detecting unit
16 Time curve of the battery voltage
17 Time curve of the battery current
18 Digital filter
$I_{Batt}$ Battery current
UA Output voltage
$U_{Batt}$ Battery voltage
UE Input voltage
UV Specified voltage The invention has been described in the preceding using various exemplary embodiments. Other variations to the disclosed embodiments may be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor, device, or other unit may be arranged to fulfil the functions of several items recited in the claims. Likewise, multiple processors, devices, or other units may be arranged to fulfil the functions of several items recited in the claims.

The term "exemplary" used throughout the specification means "serving as an example, instance, or exemplification" and does not mean "preferred" or "having advantages" over other embodiments. The term "in particular" and "particularly" used throughout the specification means "for example" or "for instance".

The mere fact that certain measures are recited in mutually different dependent claims or embodiments does not indicate that a combination of these measures cannot be used to advantage. Any reference signs in the claims should not be construed as limiting the scope.

What is claimed is:

1. A method for evaluating an electric connection of an electric energy storage device to an onboard electrical system of an at least partially electrically operated vehicle, wherein the onboard electrical system is supplied with electric energy by the electric energy storage device, and with a voltage converter of the onboard electrical system, which is connected to the electric energy storage device, at least one component of the onboard electrical system is supplied with an output voltage of the voltage converter, the method comprising:

changing a specified voltage of the voltage converter, by which the output voltage can be specified, in a specified time interval, whereby a battery voltage and a battery current of the electric energy storage device can be influenced;

detecting the battery voltage of the electric energy storage device within the time interval;

detecting the battery current of the electric energy storage device within the time interval;

comparing a time curve of the battery voltage and a time curve of the battery current; and evaluating the electric connection of the electric energy storage device to the onboard electrical system depending on the compared time curves of the battery voltage and of the battery current; wherein comparing the time curves of the battery voltage and of the battery current comprises determining if these two time curves are in phase.

2. The method of claim 1, wherein the specified voltage is changed in the time interval such that a voltage value of the specified voltage is increased or decreased by a specified voltage value.

3. The method of claim 1, wherein by changing the specified voltage, a determination of an internal resistance of the electric energy storage device is excited.

4. The method of claim 3, wherein the determination of the internal resistance is performed depending on an average voltage of the time curve of the battery voltage and an average current of the time curve of the battery current.

5. The method of claim 1, wherein the change of the specified voltage is effected depending on a specified switching frequency.

6. The method of claim 1, wherein for comparing the time curves of the battery voltage and of the battery current, the time curves are filtered with a digital filter depending on the changed specified voltage.

7. The method of claim 1, wherein immediately after changing the specified voltage, a step response is respectively ascertained as the time curve of the battery voltage and of the battery current.

8. An electronic battery evaluating system with a processor and at least one detector, wherein the electronic battery evaluating system is configured for:

changing a specified voltage of a voltage converter, by which an output voltage can be specified, in a specified time interval, whereby a battery voltage and a battery current of an electric energy storage device can be influenced;

detecting the battery voltage of the electric energy storage device within the time interval;

detecting the battery current of the electric energy storage device within the time interval;

comparing a time curve of the battery voltage and a time curve of the battery current; and evaluating an electric connection of the electric energy storage device to an onboard electrical system depending on the compared time curves of the battery voltage and of the battery current, wherein comparing the time curves of the battery voltage and of the battery current comprises determining if these two time curves are in phase.

9. A vehicle with an electronic battery evaluating system of claim 8.

10. The vehicle of claim 9, wherein the specified voltage is changed in the time interval such that a voltage value of the specified voltage is increased or decreased by a specified voltage value.

11. The vehicle of claim 9, wherein by changing the specified voltage, a determination of an internal resistance of the electric energy storage device is excited.

12. The electronic battery evaluating system of claim 8, wherein the specified voltage is changed in the time interval such that a voltage value of the specified voltage is increased or decreased by a specified voltage value.

13. The electronic battery evaluating system of claim 8, wherein by changing the specified voltage, a determination of an internal resistance of the electric energy storage device is excited.

14. The electronic battery evaluating system of claim 13, wherein the determination of the internal resistance is performed depending on an average voltage of the time curve of the battery voltage and an average current of the time curve of the battery current.

15. The electronic battery evaluating system of claim 8, wherein the change of the specified voltage is effected depending on a specified switching frequency.

16. The electronic battery evaluating system of claim 8, wherein for comparing the time curves of the battery voltage and of the battery current, the time curves are filtered with a digital filter depending on the changed specified voltage.

17. The electronic battery evaluating system of claim 8, wherein immediately after changing the specified voltage, a step response is respectively ascertained as the time curve of the battery voltage and of the battery current.

* * * * *